United States Patent
Talegaonkar et al.

(10) Patent No.: US 11,728,817 B2
(45) Date of Patent: *Aug. 15, 2023

(54) CLOCK AND DATA RECOVERY DEVICES WITH FRACTIONAL-N PLL

(71) Applicant: Marvell Asia Pte Ltd., Singapore (SG)

(72) Inventors: Mrunmay Talegaonkar, Laguna Hills, CA (US); Jorge Pernillo, Daly City, CA (US); Junyi Sun, Singapore (SG); Praveen Prabha, Lake Forest, CA (US); Chang-Feng Loi, Singapore (SG); Yu Liao, Longmont, CO (US); Jamal Riani, Fremont, CA (US); Belal Helal, Santa Clara, CA (US); Karthik S. Gopalakrishnan, Cupertino, CA (US); Aaron Buchwald, Newport Beach, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/567,588

(22) Filed: Jan. 3, 2022

(65) Prior Publication Data
US 2022/0190836 A1    Jun. 16, 2022

Related U.S. Application Data

(63) Continuation of application No. 17/013,307, filed on Sep. 4, 2020, now Pat. No. 11,218,156, which is a continuation of application No. 16/127,103, filed on Sep. 10, 2018, now Pat. No. 10,804,913.

(51) Int. Cl.
*H03L 7/197* (2006.01)
*H04L 7/033* (2006.01)
*H03L 7/099* (2006.01)
*H03L 7/087* (2006.01)
*H03L 7/08* (2006.01)

(52) U.S. Cl.
CPC ............ *H03L 7/1976* (2013.01); *H03L 7/087* (2013.01); *H03L 7/0807* (2013.01); *H03L 7/099* (2013.01); *H04L 7/0331* (2013.01)

(58) Field of Classification Search
CPC ..... H04L 7/0331; H03L 7/091; H03L 7/0087; H03L 2207/50; H03L 7/1974; H03L 7/099; H03L 7/087; H03L 7/0807; H03L 7/1976

See application file for complete search history.

(56) References Cited

U.S. PATENT DOCUMENTS

| | | | |
|---|---|---|---|
| 5,105,192 A | 4/1992 | Takahashi | |
| 7,312,642 B1 | 12/2007 | Li et al. | |
| 8,384,453 B1 * | 2/2013 | Caviglia | ............... H03L 7/0992 327/147 |
| 8,674,731 B1 * | 3/2014 | Hellmer | ................. H03L 7/235 327/147 |

(Continued)

*Primary Examiner* — Aristocratis Fotakis

(57) ABSTRACT

The present invention relates to data communication and electrical circuits. More specifically, embodiments of the present invention provide a clock and data recovery (CDR) architecture implementation for high data rate wireline communication links. In an embodiment, a CDR device includes a phase detector, a loop filter, and a fractional-N PLL. The fractional-N PLL generates output clock signal based on output of the loop filter. There are other embodiments as well.

11 Claims, 22 Drawing Sheets

(56) References Cited

U.S. PATENT DOCUMENTS

| | | |
|---|---|---|
| 9,065,459 B1 | 6/2015 | Buell |
| 9,306,730 B1* | 4/2016 | Shu ........................ H03L 7/081 |
| 10,291,389 B1 | 5/2019 | Midha |
| 10,594,329 B1 | 3/2020 | Elkholy |
| 2005/0077935 A1 | 4/2005 | Giuroiu |
| 2006/0222134 A1 | 10/2006 | Eldredge et al. |
| 2008/0001657 A1* | 1/2008 | Zhang ...................... H03H 7/06 |
| | | 327/552 |
| 2009/0027861 A1 | 1/2009 | Ohl et al. |
| 2009/0085679 A1 | 4/2009 | Jennings et al. |
| 2012/0074993 A1* | 3/2012 | Chen ........................ H03L 1/00 |
| | | 327/147 |
| 2012/0105114 A1 | 5/2012 | Yun et al. |
| 2013/0082754 A1 | 4/2013 | Chern et al. |
| 2013/0222067 A1 | 8/2013 | Yin et al. |
| 2015/0078495 A1* | 3/2015 | Hossain .................. H04L 27/32 |
| | | 375/346 |
| 2015/0145569 A1 | 5/2015 | Perrott |
| 2015/0145571 A1 | 5/2015 | Perrott |
| 2015/0162922 A1 | 6/2015 | Song et al. |
| 2016/0294398 A1* | 10/2016 | Verlinden ............... H03L 7/087 |
| 2017/0093459 A1 | 3/2017 | Dan |
| 2017/0207906 A1 | 7/2017 | Dawkins |
| 2018/0013434 A1 | 1/2018 | Amirkhany et al. |
| 2018/0138920 A1 | 5/2018 | Sharma et al. |
| 2018/0294817 A1 | 10/2018 | Mayer et al. |
| 2019/0310587 A1* | 10/2019 | Kim ........................ H03L 7/095 |

* cited by examiner

CLOCK AND DATA RECOVERY DEVICES WITH FRACTIONAL-N PLL

CROSS-REFERENCE TO RELATED APPLICATIONS

The present disclosure is a continuation of U.S. patent application Ser. No. 17/013,307, filed on Sep. 4, 2020, which is a continuation of U.S. patent application Ser. No. 16/127,103 (now U.S. Pat. No. 10,804,913), filed Sep. 10, 2018. The entire disclosures of the applications referenced above are incorporated herein by reference.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND

The present invention relates to data communication and electrical circuits.

Over the last few decades, the use of communication networks has exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily.

Clock and data recovery (CDR) devices are used in a wide range of applications. For example, to process data received over a communication network, a receiver relies on its CDR to generate a clock signal based on the received data. The performance of the receiver relies on the performance of its CDR and other components. Over the time, there have been many different types of CDR designs and implementations, however, they have been inadequate for the reasons explained below. Therefore, new and improved CDR devices are desired.

SUMMARY

The present invention relates to data communication and electrical circuits. More specifically, embodiments of the present invention provide a clock and data recovery (CDR) architecture implementation for high data rate wireline communication links. In an embodiment, a CDR device includes a phase detector, a loop filter, and a fractional-N PLL. The fractional-N PLL generates output clock signal based on output of the loop filter. There are other embodiments as well.

According to an embodiment, the present invention provides A clock data recovery (CDR) device, which includes a first phase detection module configured to receive digital input signal and determine a difference between phases of the digital input signal and an output clock signal. The device additionally includes a loop filter module coupled to the phase detector module and configured to generate a frequency control word. The device also includes a fractional-N phase lock loop (Frac-N PLL) configured to generate the output clock signal based on the frequency control word. The Frac-N PLL includes a second phase detection module coupled to a reference clock signal. The Frac-N PLL also includes a charge pump coupled to the second phase detection module. The Frac-N PLL additionally includes an analog loop filter coupled to the charge pump. The Frac-N PLL also includes a sigma delta modulator configured to process the frequency control word.

According to another embodiment, the present invention provides a clock data recovery (CDR) device that includes a first phase detection module configured to receive digital input signal and determine a difference between phases of the digital input signal and an output clock signal. The device also includes a loop filter module coupled to the phase detector module and configured to generate a frequency control word. The device additionally includes a fractional-N phase lock loop (Frac-N PLL) configured to generate the output clock signal based on the frequency control word, the Frac-N PLL comprising a high-pass filter for processing the frequency control word. The high-pass filter has an inverse filter and an anti-aliasing filter.

According to yet another embodiment, the present invention provides a clock data recovery (CDR) device, which has a first phase detection module configured to receive digital input signal and determine a difference between the digital input signal and an output clock signal. The device also includes a loop filter module coupled to the phase detector module and configured to generate a frequency control word. The device additionally includes a fractional-N phase lock loop (Frac-N PLL) configured to generate the output clock signal based on the frequency control word. The Frac-N PLL has a voltage controlled oscillator configured on a feedforward signal path and a current mode digital-to-analog converter.

It is to be appreciated that embodiments of the present invention provide many advantages over conventional techniques. Among other things, CDR devices implemented according to embodiments of the present invention are smaller and more efficient compared to existing devices (e.g., phase-interpolator or digitally controlled oscillator implementations). For example, compared to CDRs with digitally controlled oscillators, CDRs with fractional-N PLL have better immunity to various types of coupling noise. Additionally, a fractional-N PLL based CDR can provide independent gain suitable for the CDR device.

Embodiments of the present invention can be implemented in conjunction with existing systems and processes. For example, CDR devices implemented with Frac-N PLLs according to the present invention can be used for a wide range of applications and are compatible with existing systems and architectures. Additionally, CDR devices according to the present invention can be manufactured using existing manufacturing processes and equipment. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DESCRIPTION

Figure 1:
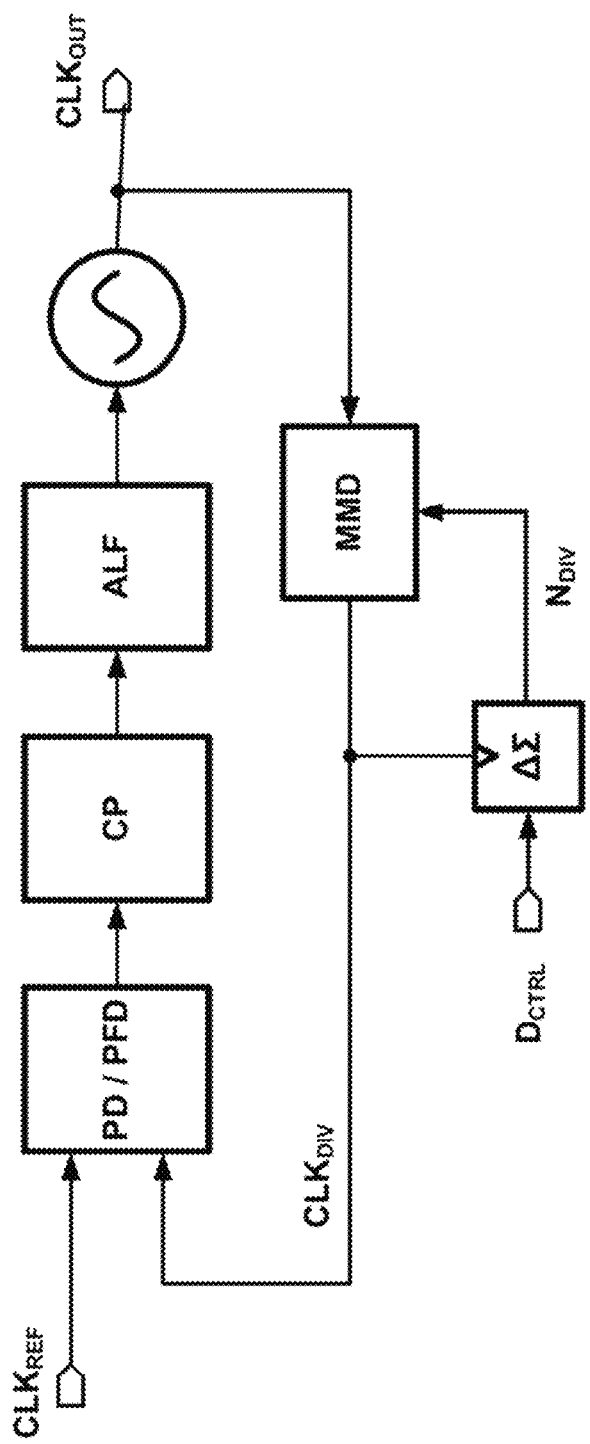
FIG. 1 is a simplified diagram illustrating a fractional-N PLL according to an embodiment of the present invention.

The present invention relates to data communication and electrical circuits. More specifically, embodiments of the present invention provide a clock and data recovery (CDR) architecture implementation for high data rate wireline communication links. In an embodiment, a CDR device includes a phase detector, a loop filter, and a fractional-N PLL. The fractional-N PLL generates output clock signal based on output of the loop filter. There are other embodiments as well.

Low-jitter CDR architectures are often an essential aspect for high data rate wireline receivers. While some of the early CDRs utilized analog voltage-controlled oscillator (VCO) based architectures, phase interpolator (PI)-based clock data recovery (CDR) modules have come to dominate CDR loop implementations due to their relative small-area (as compared to other designs and architectures) and digital control functionality. A shift towards analog-to-digital converter (ADC) based receivers (thus moving from analog to digital) has made digital control necessary for CDR loop implementations. Phase interpolators provide this functionality by converting digital phase control input signal to analog clock phase shift signal at the output. Performance of a PI in a CDR implementation requires high linearity, high output phase resolution, and high-clock-frequency operation. Unfortunately, designing highly linear PIs with high output phase resolution at high clock frequency is difficult.

As a result, CDR architectures utilizing PIs struggle to achieve the low-jitter performance criteria needed for high data rate operation. An alternative to PI-based CDR is a digitally controlled oscillator (DCO) based CDR architecture. The low-jitter requirement mentioned above precludes the use of ring oscillator based DCOs applications that require high data rates. For example, LC-based DCO (LC DCO) can potentially provide low jitter, but they are susceptible to electromagnetic coupling due to low CDR bandwidth achieved by typical high data rate links.

It is thus to be appreciated that embodiments of the present invention provide high-performance CDRs implemented with fractional-N (Frac-N) phase-lock loops (PLL). More specifically, embodiments of the present invention provide CDRs with wide bandwidth Frac-N PLLs to provide the functionalities of digitally controlled oscillators and reduce susceptibility of LC-VCOs to electromagnetic coupling, while providing low jitter digital phase shift capability to CDR loops. In an exemplary embodiment, a CDR architecture is designed to eliminate the need for phase interpolator (PI) by employing fractional-N phase-locked loop (PLL), and it is capable of achieving low-jitter performance critical for high-data rate applications. The present invention also provides methods to ensure CDR loop stability. The present invention additionally provides calibration technique to ensure robust operation.

As an example, the following techniques are provided:

Use of fractional-N (analog or digital) PLLs in CDR loops for phase and frequency tracking;

Digital high-pass filter based technique for compensating adverse effects (such as stability and error transfer function peaking) caused due to introduction of Frac-N PLL in CDR loop;

Charge pump feedforward techniques for compensating adverse effects (such as stability and error transfer function peaking) caused due to introduction of Frac-N PLL in CDR loop;
  A variation of this technique can be used for digital fractional-N PLLs;

VCO feedforward techniques for compensating adverse effects (such as stability and error transfer function peaking) caused due to introduction of an analog or digital Frac-N PLL in CDR loop;

VCO feedforward gain calibration techniques for in-situ calibration of parallel path gain mismatch in VCO feedforward scheme.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a simplified diagram illustrating a fractional-N PLL according to an embodiment of the present invention. This diagram is merely an example, which should not unduly limit the scope of the claims. One of ordinary skill in the art would recognize many variations, alternatives, and modifications. The PLL includes a phase detector (PD) or phase and frequency detector (PFD), a charge pump (CP), an analog loop filter (ALF), a voltage-controlled oscillator (VCO), multi-modulus divider (MMD), and a digital ΔΣ modulator (ΔΣ). The input reference clock is denoted as $CLK_{REF}$, and the output clock is denoted as $CLK_{OUT}$. A high resolution digital frequency control signal, $D_{CTRL}$, is converted to an integer division ratio, $N_{DIV}$, by a digital ΔΣ modulator. The output of the multi-modulus divider (MMD) is divided clock signal denoted as $CLK_{DIV}$. The output frequency, $F_{OUT}$, of such a fractional-N PLL depends on the input reference frequency $F_{REF}$ and $D_{CTRL}$, which is described in Equation 1 below:

$$F_{OUT} = D_{CTRL} F_{REF} \qquad \text{Equation 1:}$$

Figure 2:
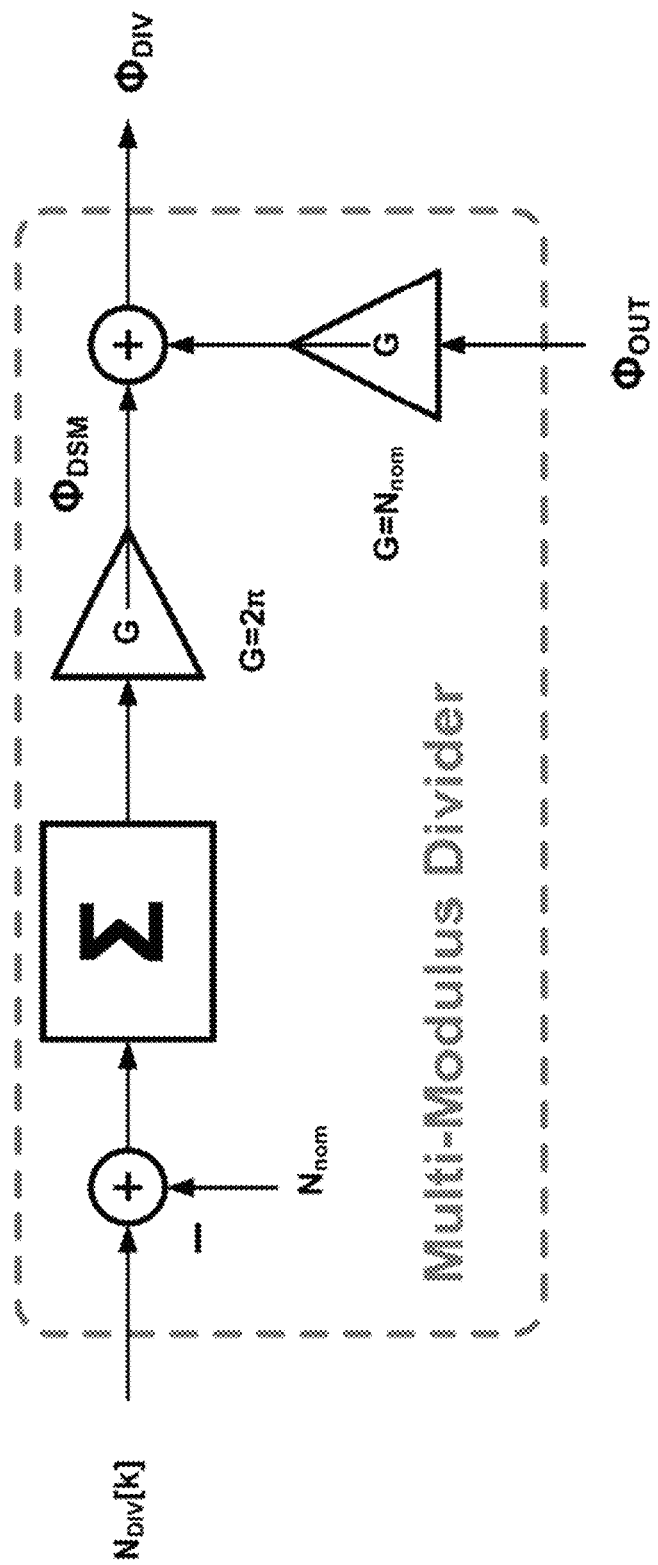
FIG. 2 provides a small signal model of a multi-modulus divider according to embodiments of the present invention.

It is to be noted that $D_{CTRL}$ can be used to control not only the output frequency, but also the output phase of the Frac-N PLL. FIG. 2 provides a small signal model of a multi-modulus divider according to embodiments of the present invention. This diagram is merely an example, which should not unduly limit the scope of the claims. One of ordinary skill in the art would recognize many variations, alternatives, and modifications. It can be shown that the overall output phase of the MMD is given by Equation 2 below:

$$\Phi_{DIV}(z) = N_{nom}\Phi_{OUT}(z) + 2\pi(N_{DIV}(z) - N_{nom})\left(\frac{z^{-1}}{1-z^{-1}}\right) \qquad \text{Equation 2}$$

where $\Phi_{DIV}$ is the phase of the divider output, $\Phi_{OUT}$ is the phase of the fractional-N PLL output that is input to the MMD, $N_{nom}$ denotes the nominal division ratio of the fractional-N PLL, and $N_{DIV}$ denotes the instantaneous integer division ratio of MMD.

Equation 2 can be expressed as Equation 3:

$$\Phi_{DIV}(z) = N_{nom}\Phi_{OUT}(z) + 2\pi(D_{CTRL}(z)STF(z) - N_{nom})\left(\frac{z^{-1}}{1-z^{-1}}\right) \qquad \text{Equation 3}$$

where STF(z) is the signal transfer function of the digital ΔΣ modulator and $D_{CTRL}$ denotes the digital frequency control input. If we assume an ideal reference clock for the Frac-N PLL (i.e., $\Phi_{DIV}=0$), the output phase is given by Equation 4 below:

$$\Phi_{OUT}(z) = -\frac{2\pi}{N_{nom}}(D_{CTRL}(z)STF(z) - N_{nom})\left(\frac{z^{-1}}{1-z^{-1}}\right) \qquad \text{Equation 4}$$

Equation 4 shows that the output phase of the Frac-N PLL can be controlled using digital frequency control signal, $D_{CTRL}$.

Figure 3:
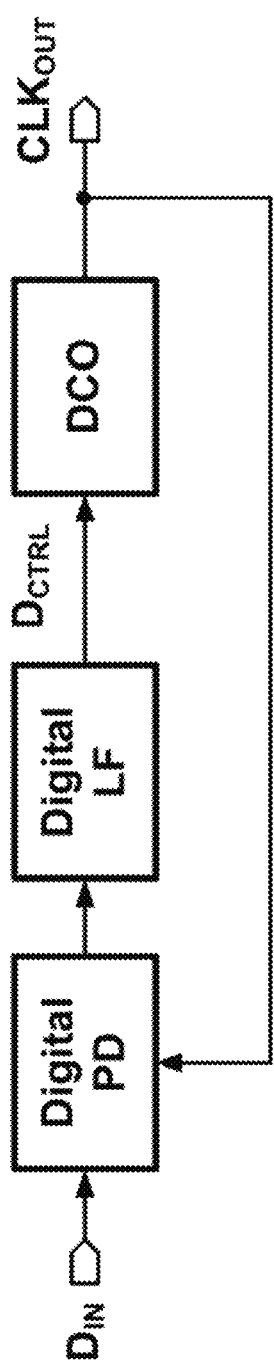
FIG. 3 is a simplified diagram illustrating a digitally controlled oscillator (DCO) based CDR loop.

FIG. 3 is a simplified diagram illustrating a DCO-based CDR loop. The phase difference between incoming data, DIN, and sampling clock $CLK_{OUT}$ is detected by a digital phase detector (Digital PD). As an example, a proportional-integral path based digital loop filter (Digital LF) is used to generate a digital frequency control word $D_{CTRL}$ for the DCO. The output frequency $F_{OUT}$ of the DCO depends on $D_{CTRL}$, and the output frequency ($F_{OUT}$) of the DCO (characterized by a DCO gain, $K_{DCO}$) is described in Equation 5 below:

$$F_{OUT} = D_{CTRL} K_{DCO} \quad \text{Equation 5:}$$

It is to be appreciated that there are similarities between DCO and Frac-N PLL. In particular, the functionality of Frac-N PLL in CDR implementations according to embodiments of the present invention is equivalent to a digitally controlled oscillator (DCO), with the functional characteristics $K_{DCO}=F_{REF}$. In various embodiments, a Frac-N PLL is used as a functional equivalent of a DCO in a CDR loop.

Compared to a stand-alone LC DCO implementation, a wide bandwidth Frac-N PLL provides better immunity to VCO coupling noise. Due to its closed loop operation, it also provides a DCO implementation with a well-defined process independent DCO gain, $K_{DCO}$.

Figure 4:
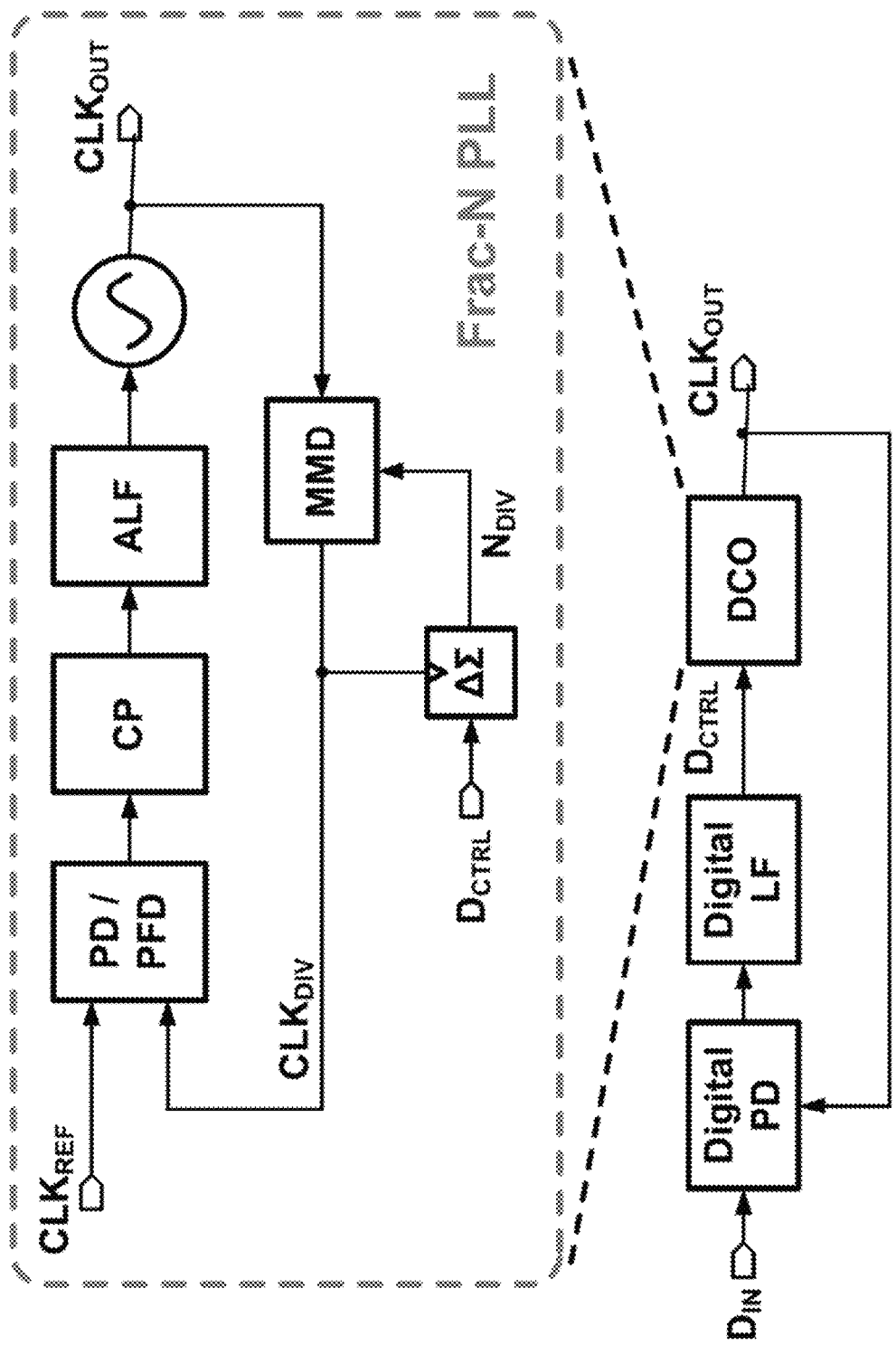
FIG. 4 is a simplified diagram illustrating a Frac-N PLL incorporated inside a CDR loop according to embodiments of the present invention.

FIG. 4 is a simplified diagram illustrating a Frac-N PLL incorporated inside a CDR loop according to embodiments of the present invention. This diagram is merely an example, which should not unduly limit the scope of the claims. One of ordinary skill in the art would recognize many variations, alternatives, and modifications. The digital frequency control word $D_{CTRL}$ (generated for CDR loop) is used as a frequency control input for a Frac-N PLL. The output clock generated by Frac-N PLL, $CLK_{OUT}$, is used as a sampling clock for the CDR loop.

As explained above, Frac-N PLL in FIG. 4 provides functionalities and advantages of an LC DCO without its penalties as used in a CDR. As an example, Frac-N PLL includes a phase detector (PD) or a phase-frequency detector (PFD) for phase detection, a charge pump for compensation, an analog loop filter (ALF) for filtering. The Frac-N PLL additionally includes an oscillator, an MMD, and a digital $\Delta\Sigma$ modulator. It is to be appreciated that Frac-N PLL can be implemented in other ways as well. It is to be understood CDRs according to the present invention can be implemented using analog Frac-N PLLs or digital Frac-N PLLs.

Figure 5:
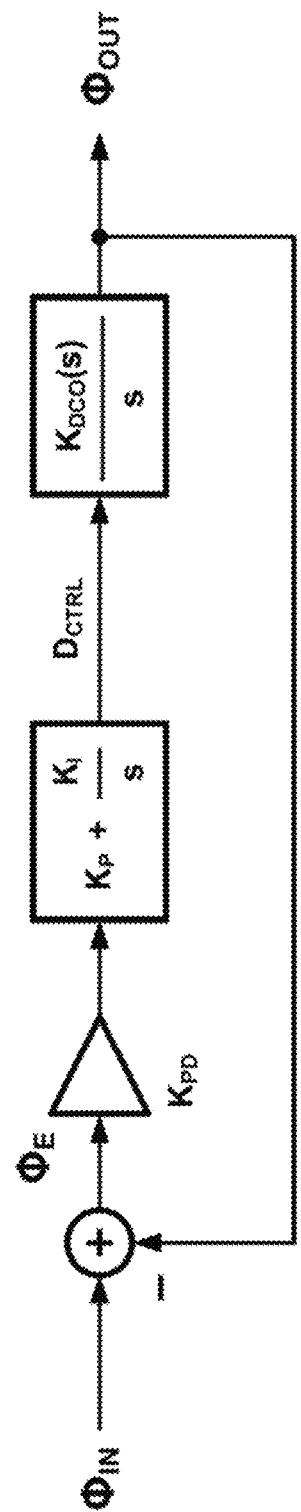
FIG. 5 is a simplified diagram illustrating small signal phase domain model of a CDR loop with a DCO.

The incorporation of a Frac-N PLL in a CDR also contributes to certain functional difference from an LC DCO implementation. After all, a Frac-N PLL is not the same as an LC DCO. More specifically, while a Frac-N PLL has well-defined gain at low frequencies, its gain rolls off at high frequencies due to low pass nature of the PLL. FIG. 5 is a simplified diagram illustrating small signal phase domain model of a CDR loop with a DCO.

In case of an ideal DCO, the gain is independent of frequency, (i.e., $K_{DCO}(s)=K_{DCO}$, where s is the reference modulation frequency). The digital loop filter is chosen to achieve appropriate CDR closed loop bandwidth and jitter tolerance. On the other hand, when Frac-N PLL is used (instead of DCO), the gain is given by $K_{DCO}(s)=F_{REF}G(s)$, where $G(s)$ is effective low-pass transfer function of the Frac-N PLL. Due to its low-pass nature, $G(s)$ introduces additional poles in the CDR loop transfer function, which adversely affects the CDR loop stability and creates peaking in the CDR error transfer function $E(s)$, where $E(s)$ is defined by $E(s)=\Phi_E(s)/\Phi_{IN}(s)$, subsequently degrading the jitter tolerance of the CDR loop. Note that jitter tolerance and error transfer function are related as $JTOL(s)=1/E(s)$.

Figure 6:
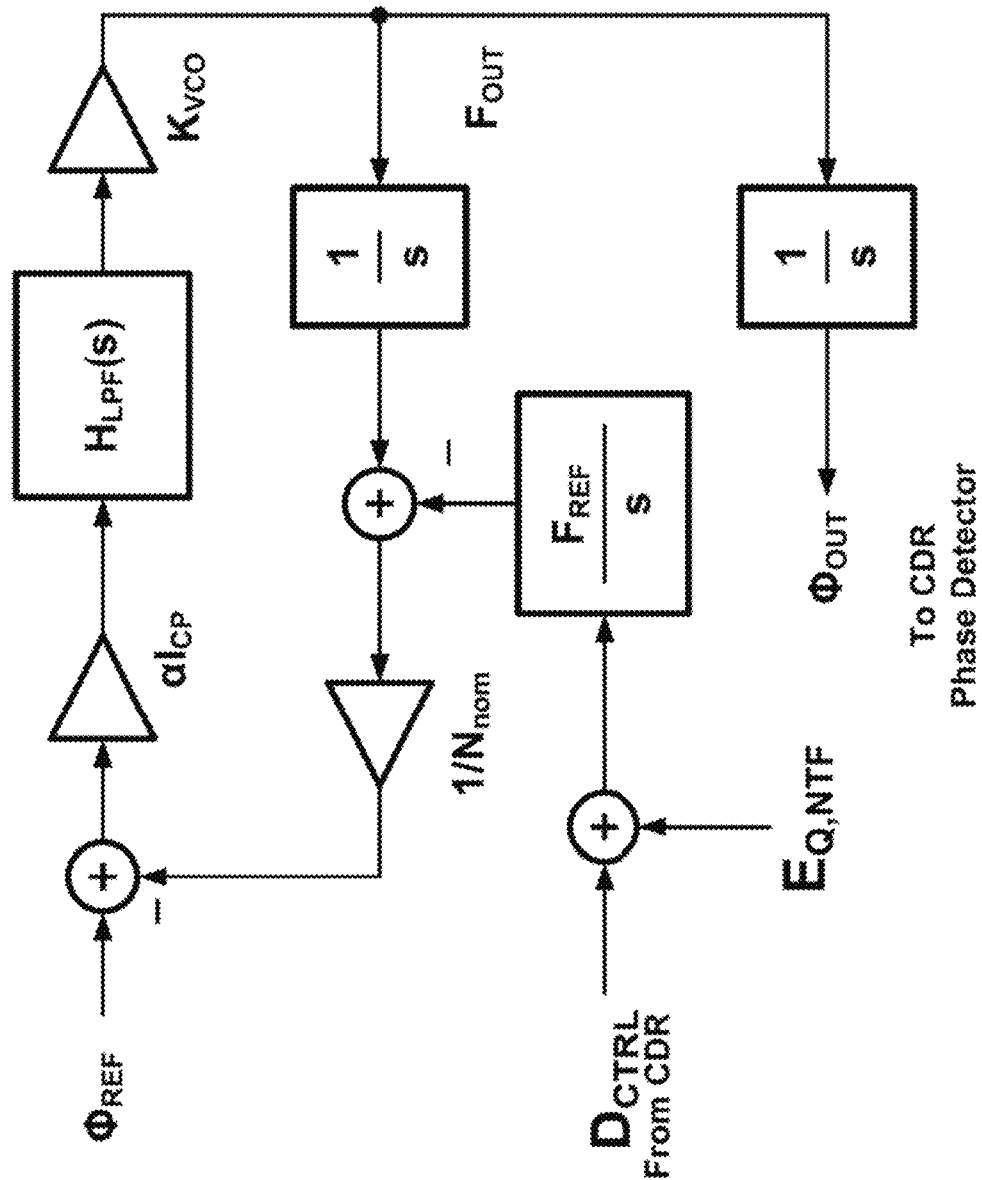
FIG. 6 is a simplified diagram illustrating a small signal model of Frac-N PLL functioning as a DCO according to embodiments of the present invention.

FIG. 6 is a simplified diagram illustrating a small signal model of Frac-N PLL functioning as a DCO according to embodiments of the present invention. This diagram is merely an example, which should not unduly limit the scope of the claims. One of ordinary skill in the art would recognize many variations, alternatives, and modifications. The function $F_{OUT}(s)$ represents the output frequency of the Frac-N PLL, while $\Phi OUT(s)$ represents its phase. The high-pass shaped quantization noise of the digital $\Delta\Sigma$ modulator is denoted as $E_{Q,NTF}(s)$. The behavior of the Frac-N PLL is described in Equation 6 below:

$$\frac{F_{OUT}(s)}{D_{CTRL}(s)} = \frac{F_{OUT}(s)}{E_{Q,NTF}(s)} = F_{REF}G(s) \quad \text{Equation 6}$$

$$\text{Where, } G(s) = \frac{LG(s)}{1+LG(s)}$$

Figure 7:
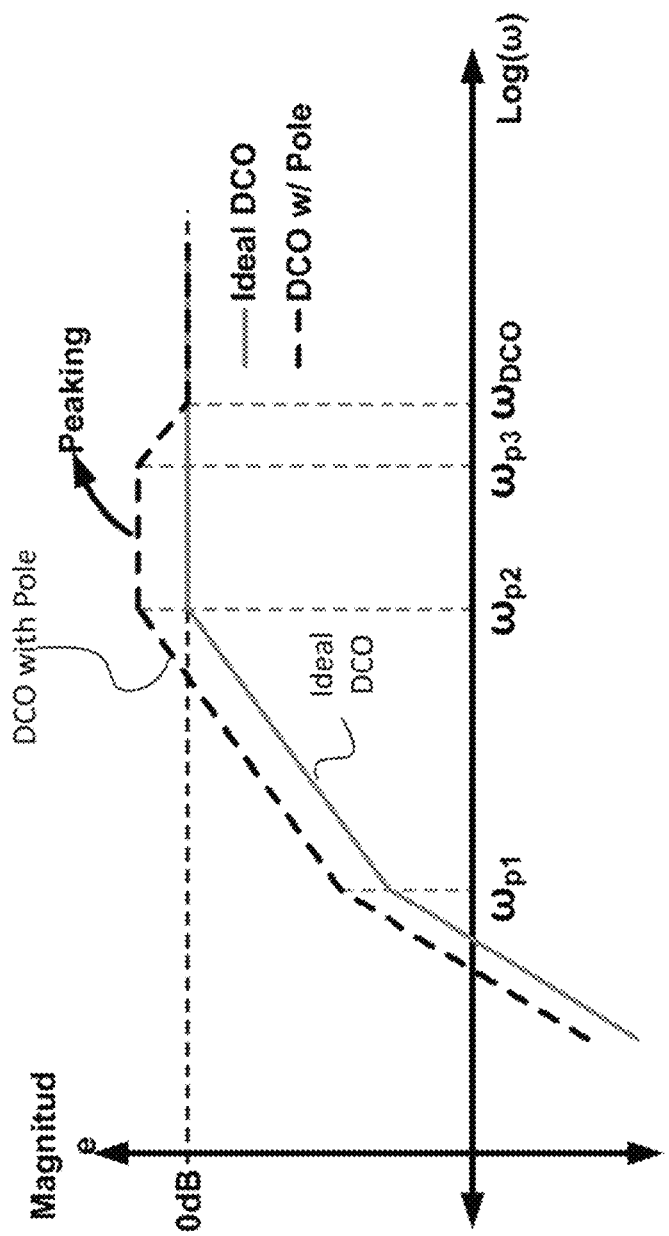
FIG. 7 is a plot illustrating CDR error transfer functions comparing ideal DCO and actual DCO implementation (e.g., with Frac-N PLL) with a pole that contributes to undesired error transfer function peaking.

In Equation 6, $LG(s)$ denotes the open loop gain of the Frac-N PLL. To reduce CDR error transfer function $E(s)$ peaking, the implementation needs to increase the bandwidth of Frac-N PLL and by extending the bandwidth of $G(s)$. This increased bandwidth, however, allows more noise from digital $\Delta\Sigma$ pass through. As a result, there is a trade-off between peaking of $E(s)$ and the output jitter of the Frac-N PLL. FIG. 7 is a plot illustrating CDR error transfer functions comparing ideal DCO and actual DCO implementation (e.g., with Frac-N PLL) with a pole that contributes to undesired error transfer function peaking.

Figure 8:
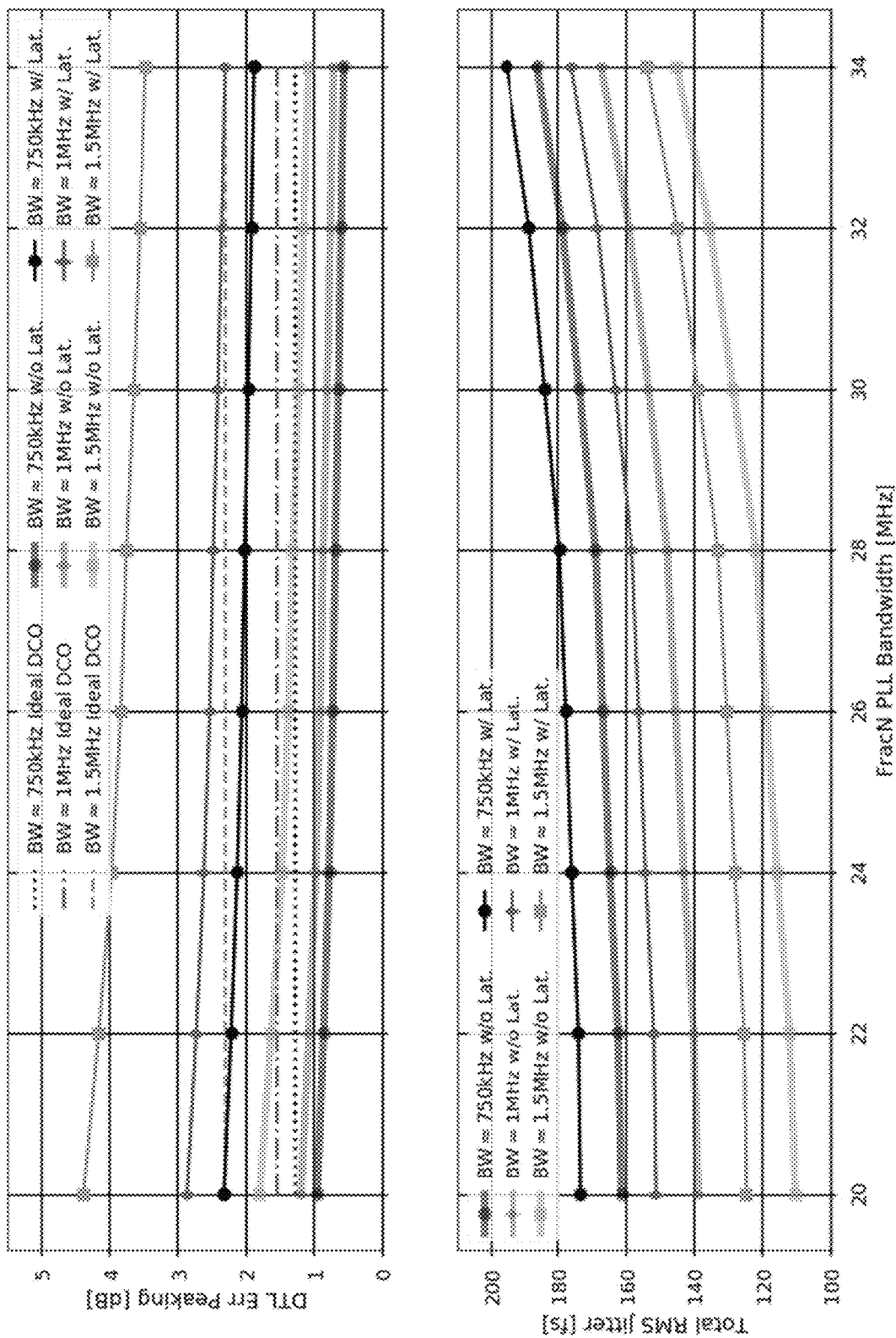
FIG. 8 provides plots illustrating CDR error transfer function peaking (top) and Frac-N PLL jitter (bottom) as function of Frac-N PLL bandwidth.

FIG. 8 provides plots illustrating CDR error transfer function peaking (top) and Frac-N PLL jitter (bottom) as function of Frac-N PLL bandwidth. As can be seen in FIG. 8, the peaking is reduced at higher PLL bandwidth at the cost of worse jitter performance. For optimal system performance, the implementation needs to reduce the bandwidth for $F_{OUT}(s)/E_{Q,NTF}(s)$ while maximizing the bandwidth for $F_{OUT}(s)/D_{CTRL}(s)$.

In various embodiments, the present invention provides feedforward techniques to compensate the bandwidth limitations of Frac-N PLL. The problem discussed in the previous section can be solved by introducing a feedforward path from $D_{CTRL}(s)$ to $F_{OUT}(s)$. Such a feedforward path can decouple the transfer function seen by $D_{CTRL}(s)$ from the transfer function seen by $E_{Q,NTF}(s)$. We propose the following methods for implementing the feedforward path.

Figure 9:
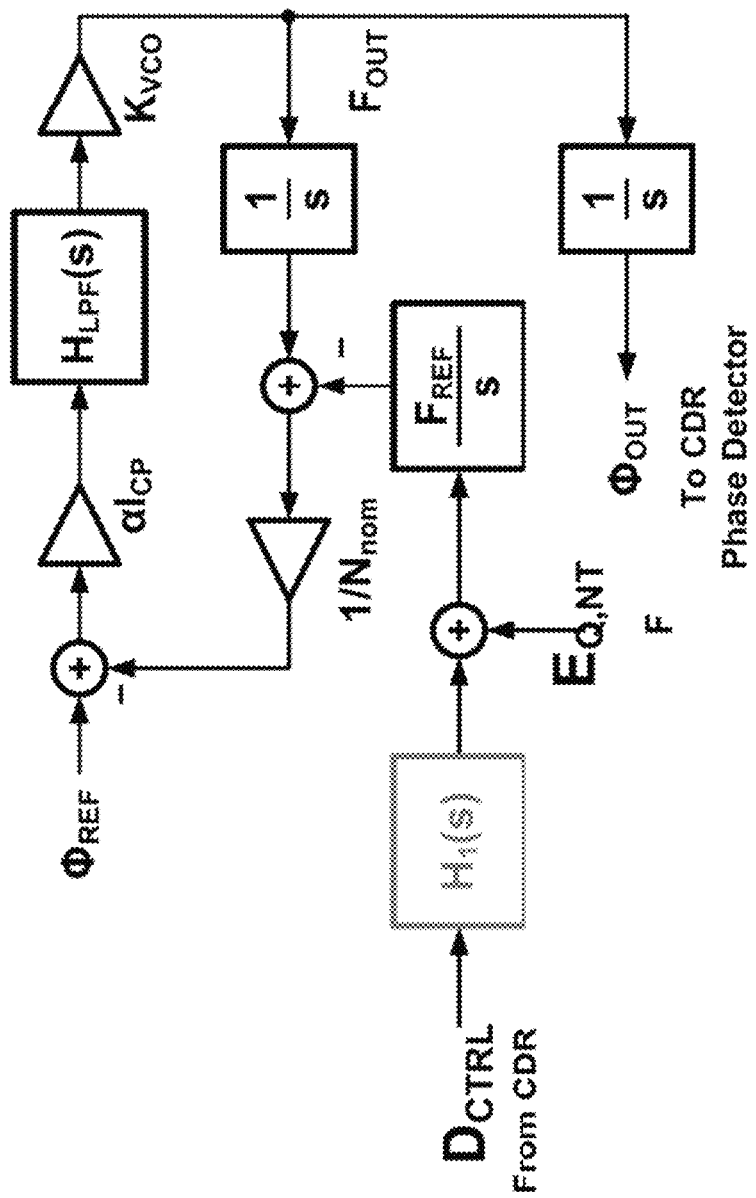
FIG. 9 is a simplified diagram illustrating a small signal model for a Frac-N PLL according to embodiments of the present invention.

According to a specific embodiment, a Frac-N PLL is implemented in a CDR with a digital high-pass filter. FIG. 9 is a simplified diagram illustrating a small signal model for a Frac-N PLL according to embodiments of the present invention. This diagram is merely an example, which should not unduly limit the scope of the claims. One of ordinary skill in the art would recognize many variations, alternatives, and modifications. It is to be appreciated that the addition of a digital high-pass filter in the $D_{CTRL}$ path can effectively counter the low-pass nature of $G(s)$. In this case, the DCO (i.e., DCO equivalent implemented with Frac-N PLL as used in a CDR) transfer function is given by Equation 7 below:

$$\frac{F_{OUT}(s)}{D_{CTRL}(s)} = F_{REF}H_1(s)G(s) \quad \text{Equation 7}$$

It is to be noted that the transfer function from $E_{Q\_NTF}$ to $F_{OUT}$ remains unchanged. For example, for $H_1(s)=G^{-1}(s)$, Equation 8 below is obtained:

$$\frac{F_{OUT}(s)}{D_{CTRL}(s)} = F_{REF}G^{-1}(s)G(s) = F_{REF} \quad \text{Equation 8}$$

Figure 10:
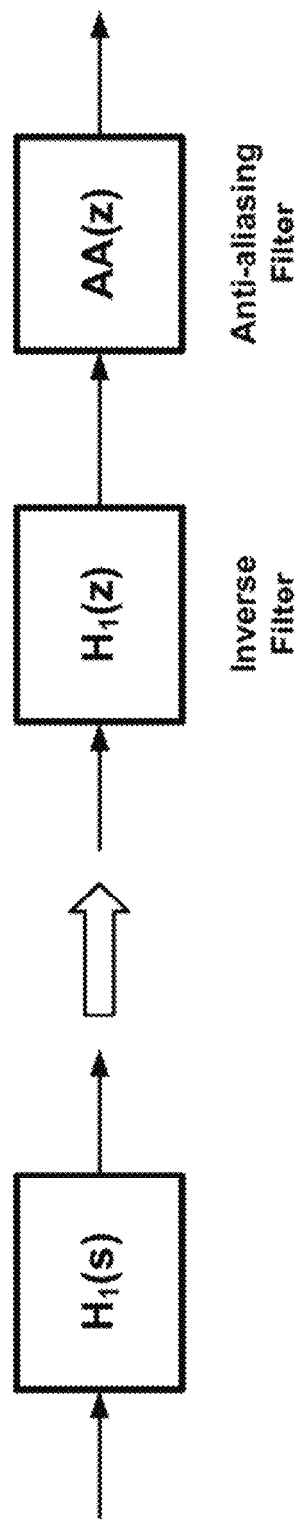
FIG. 10 is a simplified diagram illustrating a digital high-pass filter according to embodiments of the present invention.

In practical implementations, a digital finite impulse response (FIR) filter can be used to approximately match the inverse of $G(s)$. Furthermore, there is a possibility of noise in $D_{CTRL}$ signal folding back in Frac-N PLL in-band frequency region due to up-sampling in the Frac-N PLL. To alleviate this undesirable effect of out of band noise, an anti-aliasing filter is also provided in the $D_{CTRL}$ path. This anti-aliasing filter can also be implemented as a digital FIR filter. FIG. 10 is a simplified diagram illustrating a digital high-pass filter according to embodiments of the present invention. This diagram is merely an example, which should not unduly limit the scope of the claims. One of ordinary skill in the art would recognize many variations, alternatives, and modifications. For example, a digital high pass filter $H_2(s)$ includes an inverse filter $H_2(z)$ and an anti-aliasing filter AA(z).

Figure 11:
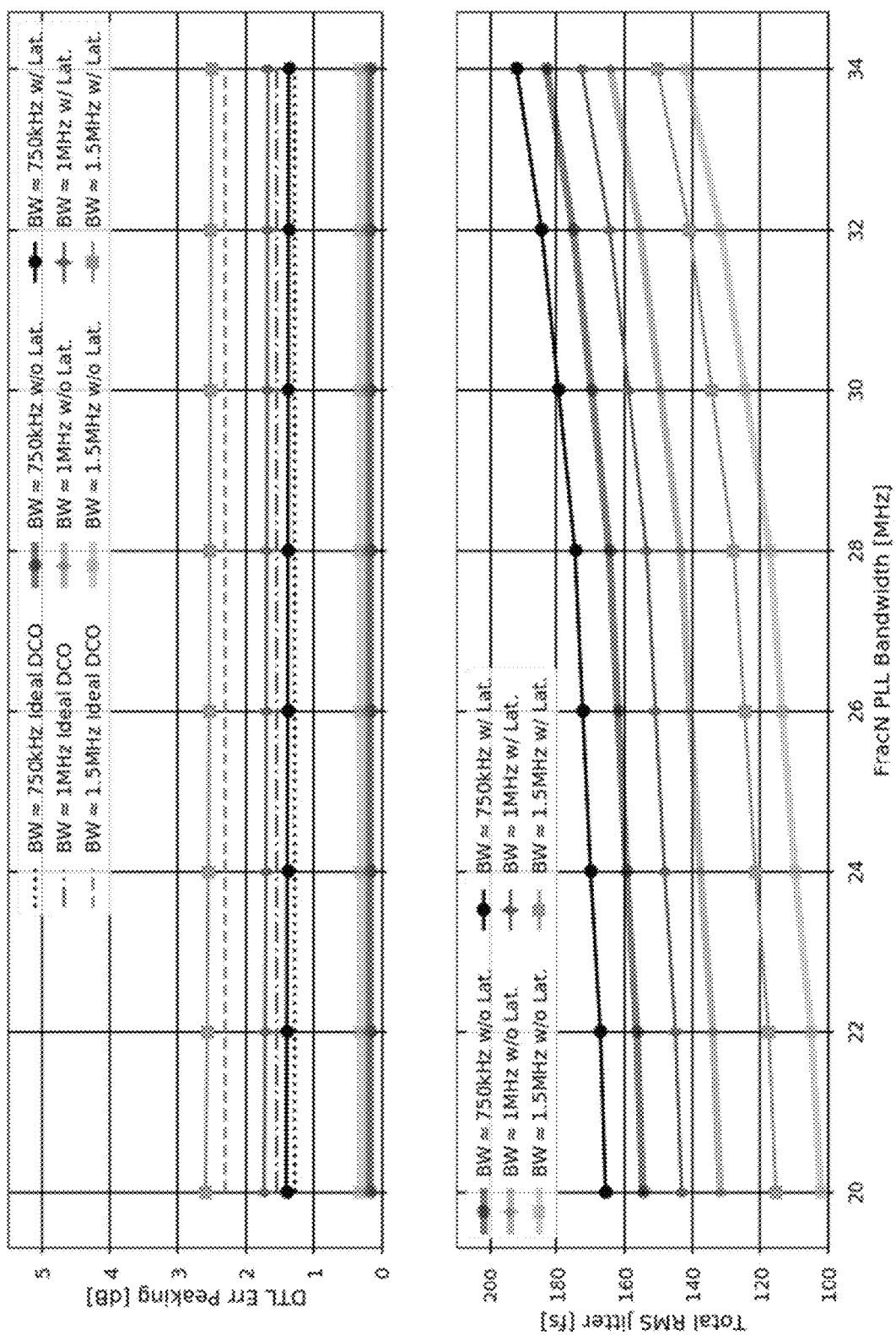
FIG. 11 provides plots showing simulated CDR error transfer function peaking (top) and output jitter (bottom) as function of Frac-N PLL bandwidth with digital high-pass filter.

FIG. 11 provides plots showing simulated CDR error transfer function peaking (top) and output jitter (bottom) as function of Frac-N PLL bandwidth with digital high-pass filter. It can be seen that the CDR error transfer function peaking becomes almost independent of Frac-N PLL bandwidth. This allows for a Frac-N PLL bandwidth that optimizes the jitter performance.

Figure 12:
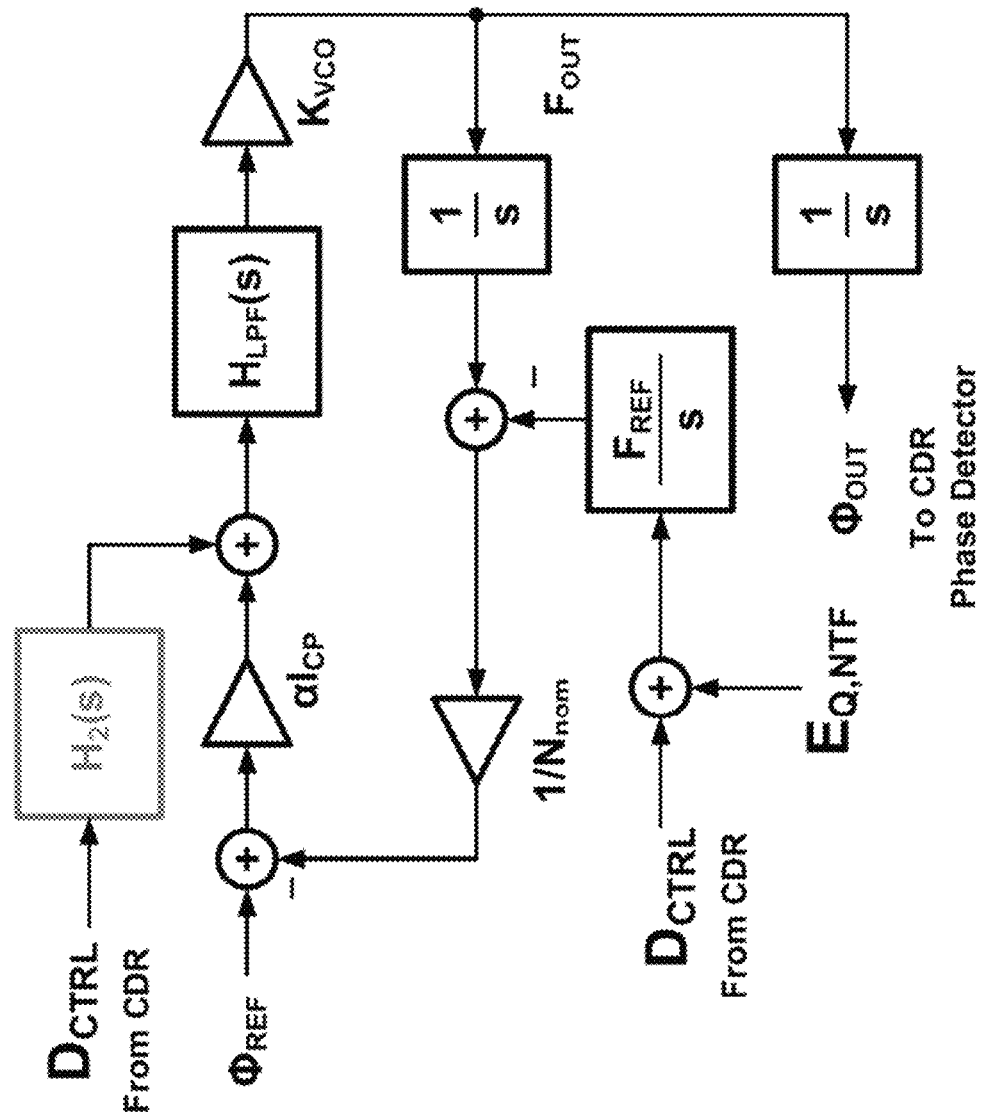
FIG. 12 is a simplified diagram illustrating a small signal model for a Frac-N PLL with charge pump according to embodiments of the present invention.

In certain embodiments, a CDR is implemented with Frac-N PLL and a charge pump, where the charge part is configured on the feedforward path. FIG. 12 is a simplified diagram illustrating a small signal model for a Frac-N PLL with charge pump according to embodiments of the present invention. This diagram is merely an example, which should not unduly limit the scope of the claims. One of ordinary skill in the art would recognize many variations, alternatives, and modifications. The DCO (i.e., DCO equivalent implemented with Frac-N PLL as used in a CDR) transfer function is provided in Equation 9 below:

$$\frac{F_{OUT}(s)}{D_{CTRL}(s)} = F_{REF}G(s) + \frac{sN_{nom}}{\alpha I_{CP}}H_2(s)G(s) \quad \text{Equation 9}$$

where $\alpha$ and $I_{CP}$ denote phase detector and charge pump gain, respectively. It is to be noted that the transfer function from $E_{Q\_NTF}$ to $F_{OUT}$ remains unchanged. If we choose $$H_2(s) = \frac{\alpha I_{CP} F_{REF}}{sN_{nom}}(G^{-1}(s) - 1),$$

Equation 10 below is obtained:

$$\frac{F_{OUT}(s)}{D_{CTRL}(s)} = F_{REF} \quad \text{Equation 10}$$

Figure 13:
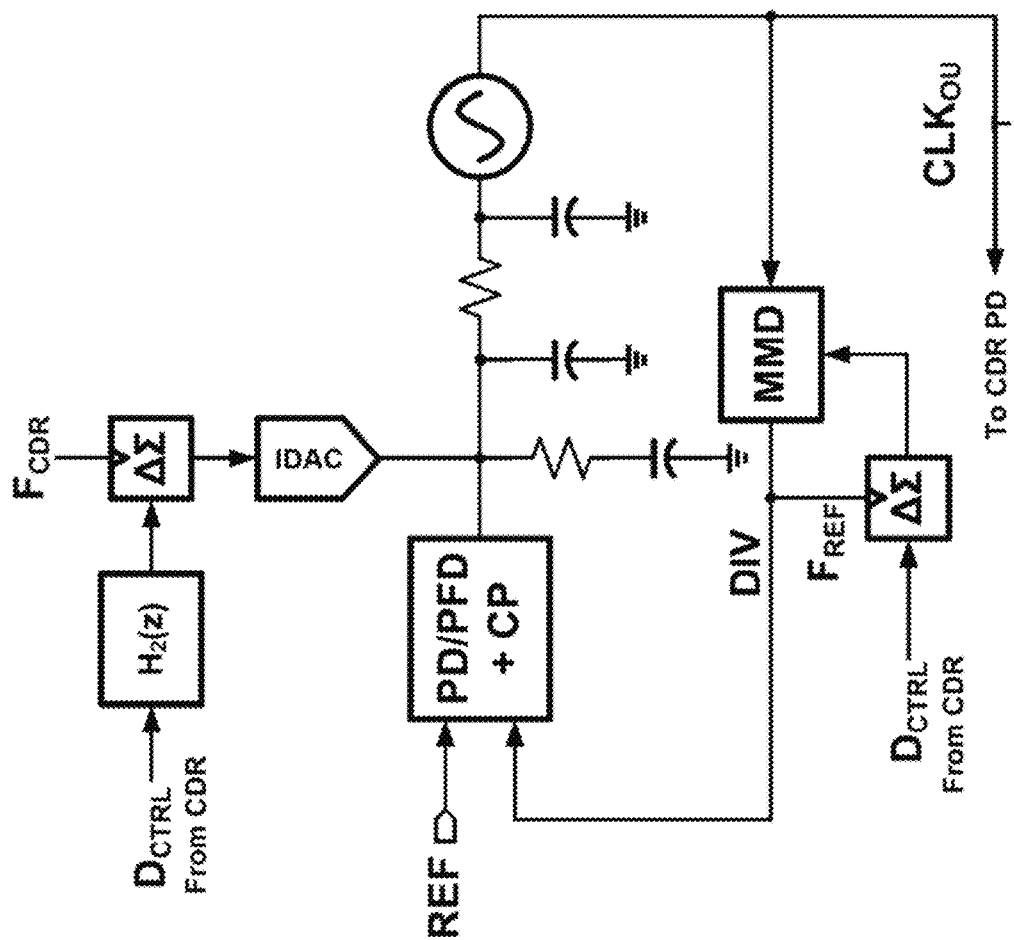
FIG. 13 is a simplified diagram illustrating a Frac-N PLL implementation with a charge pump according to embodiments of the present invention.

This feedforward path implementation requires digital filter as well as a current mode $\Delta\Sigma$ digital-to-analog converter (IDAC). FIG. 13 is a simplified diagram illustrating a Frac-N PLL implementation with a charge pump according to embodiments of the present invention. This diagram is merely an example, which should not unduly limit the scope of the claims. One of ordinary skill in the art would recognize many variations, alternatives, and modifications. The IDAC is configured with $\Delta\Sigma$ modulator in the signal path as shown. It is to be understood while PD and CP are shown in the same block in FIG. 13, they are implemented separately.

Figure 14:
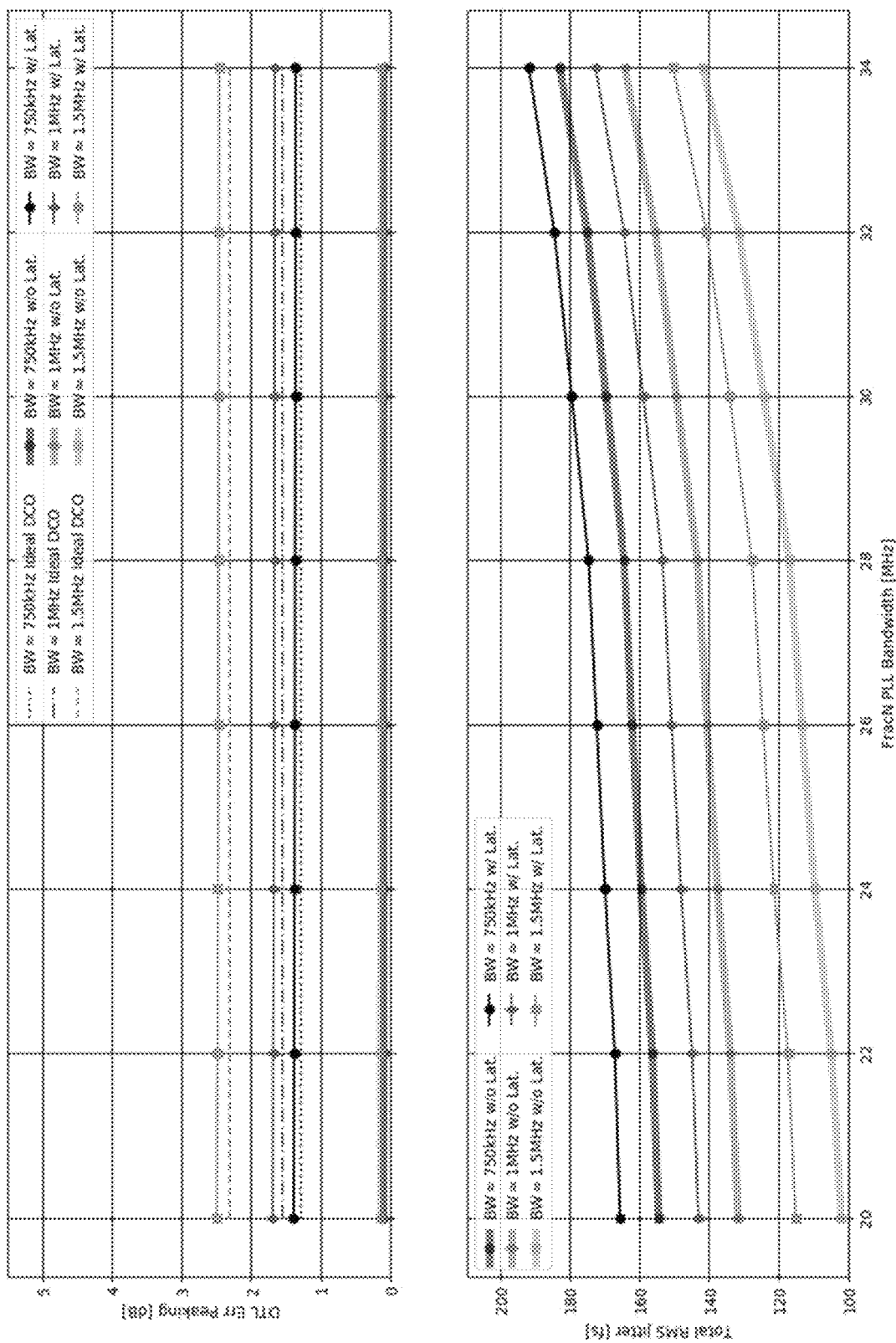
FIG. 14 shows the simulated CDR error transfer function peaking (top) and output jitter (bottom) as function of Frac-N PLL bandwidth with charge pump in the feedforward path.

FIG. 14 shows the simulated CDR error transfer function peaking (top) and output jitter (bottom) as function of Frac-N PLL bandwidth with charge pump in the feedforward path. It can be seen that the CDR error transfer function peaking becomes almost independent of Frac-N PLL bandwidth. This allows for choosing Frac-N PLL bandwidth that optimizes the jitter performance.

Figure 15:
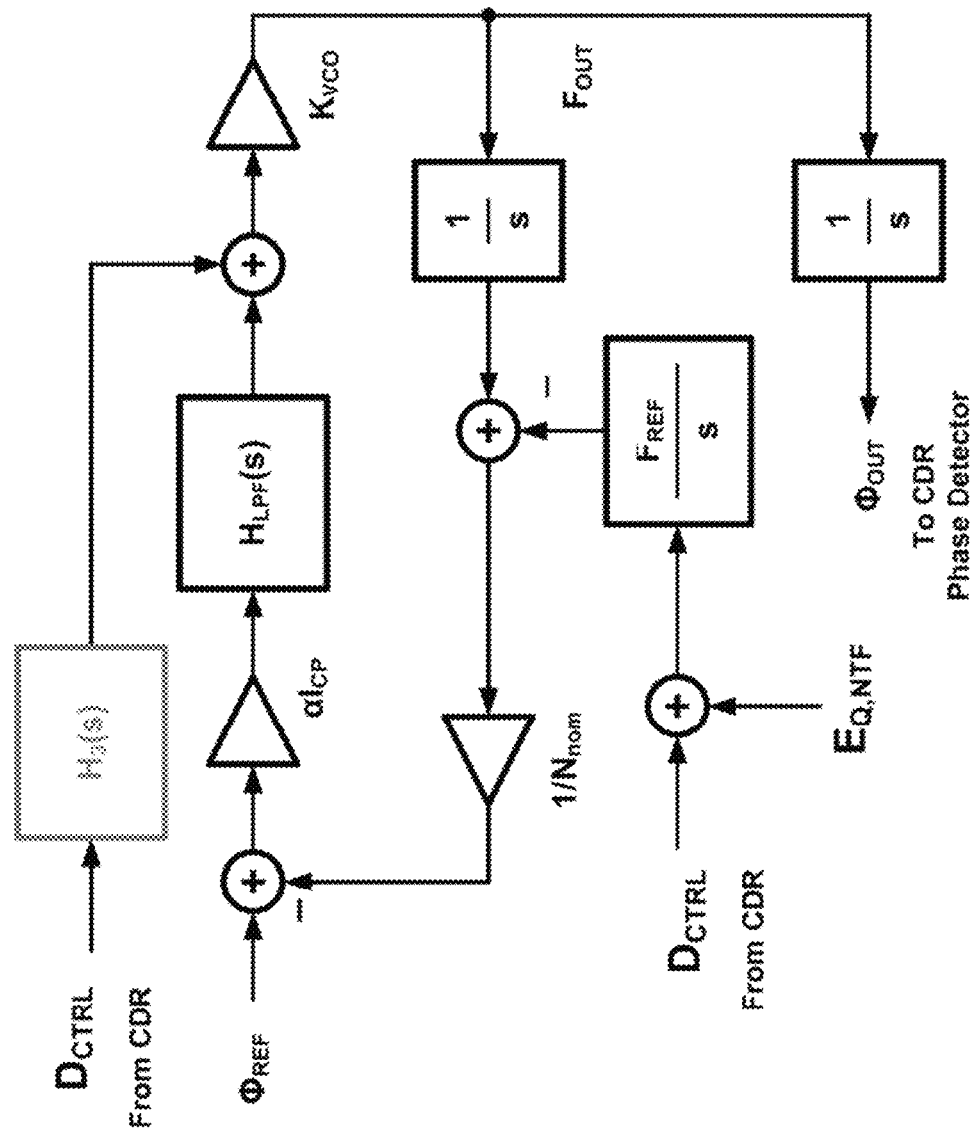
FIG. 15 is a simplified small signal model for a Frac-N PLL with feed-forward VCO path according to embodiments of the present invention.

In various embodiments, a Frac-N PLL is implemented with a feed-forward VCO path as a part of a CDR device. FIG. 15 is a simplified small signal model for a Frac-N PLL with a feed-forward VCO path according to embodiments of the present invention. This diagram is merely an example, which should not unduly limit the scope of the claims. One of ordinary skill in the art would recognize many variations, alternatives, and modifications. As shown in FIG. 15, the VCO (with gain $K_{VCO}$) is configured on the feedforward path. The DCO (i.e., DCO equivalent implemented with Frac-N PLL as used in a CDR) transfer function is described in Equation 11 below:

$$\frac{F_{OUT}(s)}{D_{CTRL}(s)} = F_{REF}G(s) + \frac{sN_{nom}}{\alpha I_{CP} H_{LPF}(s)}H_3(s)G(s) \quad \text{Equation 11}$$

where $H_{LPF}(s)$ denotes the equivalent low pass transfer function of the analog loop filter connected to charge pump output. It is to be noted that the transfer function from $E_{Q\_NTF}$ to $F_{OUT}$ remains unchanged. If we choose $$H_3(s) = \frac{F_{REF}}{K_{VCO}},$$

Equation 12 below is obtained:

$$\frac{F_{OUT}(s)}{D_{CTRL}(s)} = F_{REF} \quad \text{Equation 12}$$

Figure 16:
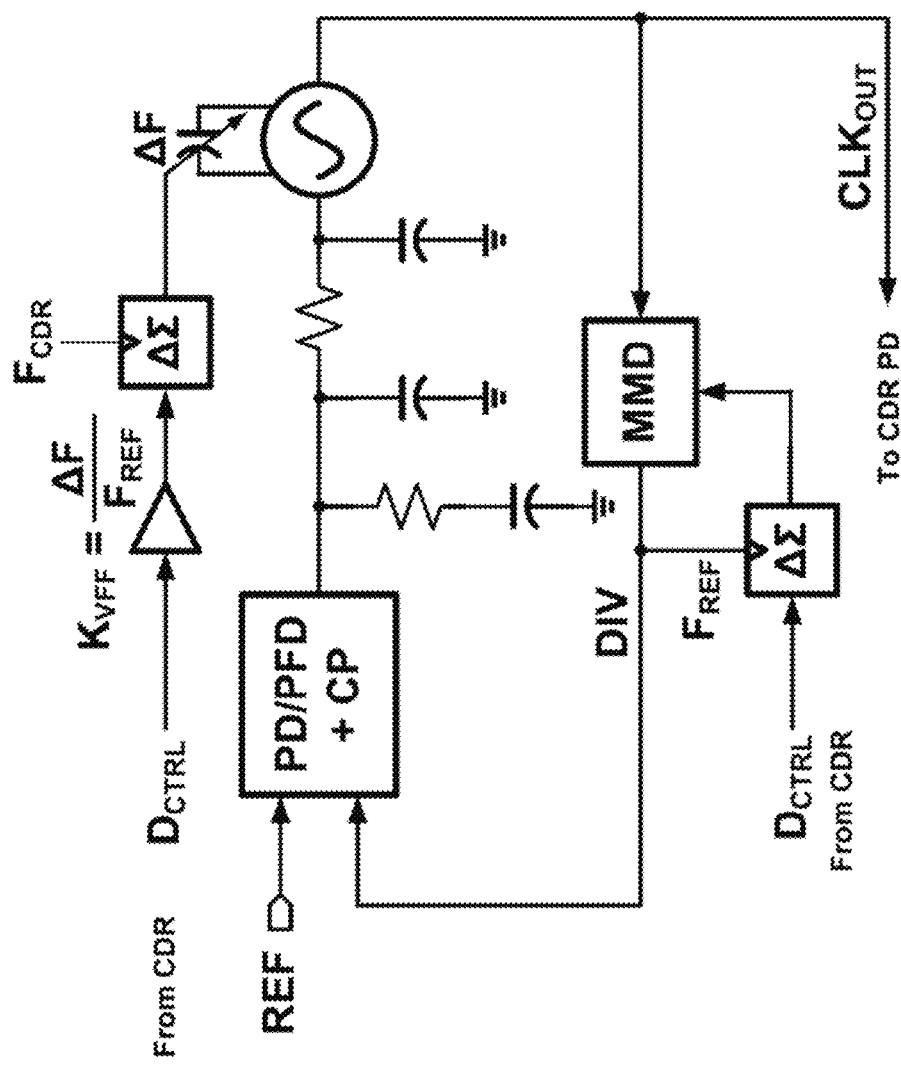
FIG. 16 is a simplified diagram illustrating a Frac-N PLL implemented with feed-forward VCO path according to embodiments of the present invention.

Since H3(s) is a constant, this feedforward path implementation requires only a $\Delta\Sigma$ digital-to-analog converter. FIG. 16 is a simplified diagram illustrating a Frac-N PLL implemented with a feed-forward VCO path according to embodiments of the present invention. This diagram is merely an example, which should not unduly limit the scope of the claims. One of ordinary skill in the art would recognize many variations, alternatives, and modifications. For example, the $\Delta\Sigma$ digital-to-analog converter can be implemented as a switching capacitor in the VCO as shown in FIG. 16. For example, a digital gain scaling factor KVFF is utilized to implement H3(s) function.

Figure 17:
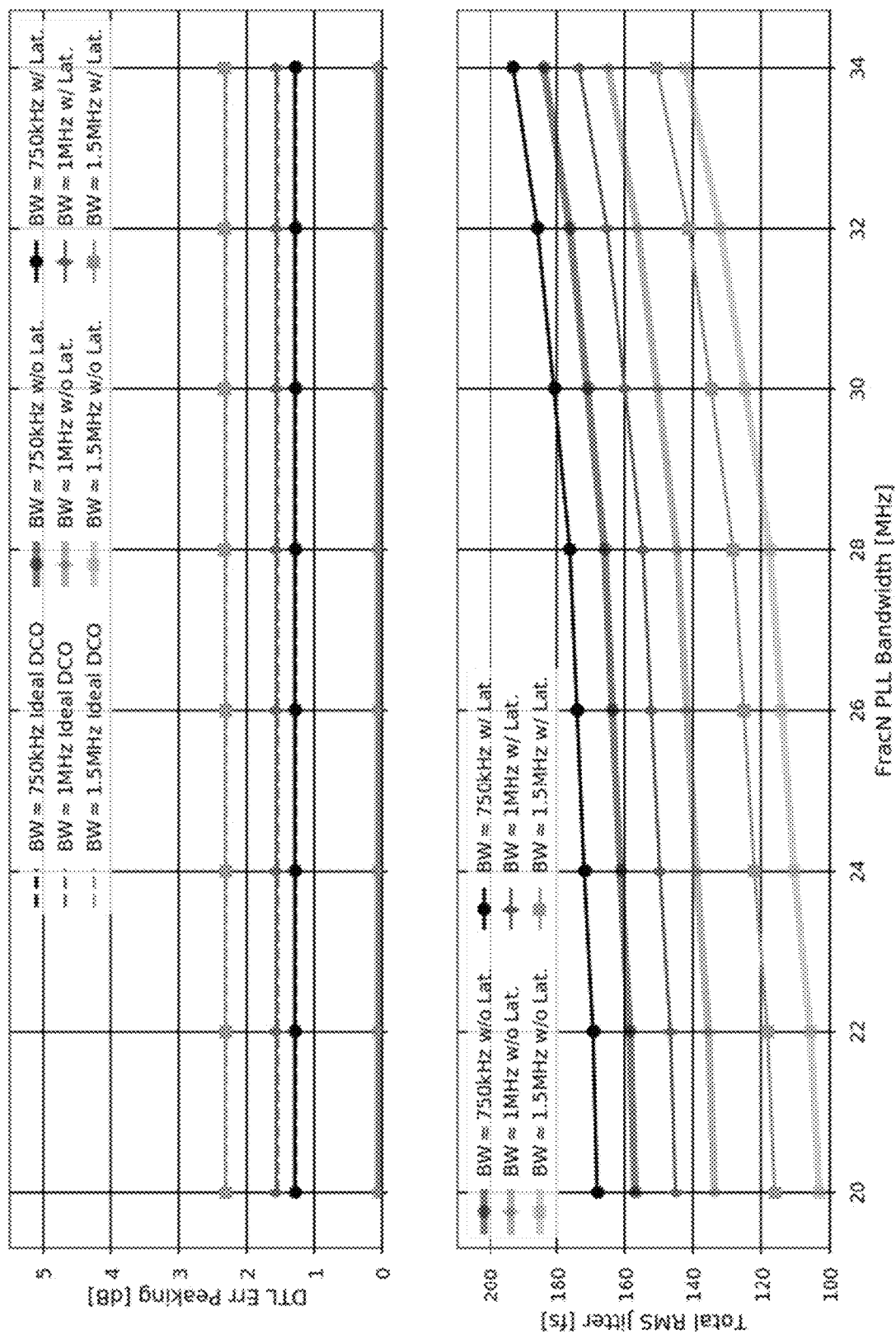
FIG. 17 shows the simulated CDR error transfer function peaking (top) and output jitter (bottom) as function of Frac-N PLL bandwidth with a feed-forward VCO path.

FIG. 17 shows the simulated CDR error transfer function peaking (top) and output jitter (bottom) as function of Frac-N PLL bandwidth with a VCO on the feedforward path. It can be seen that the CDR error transfer function peaking becomes almost independent of Frac-N PLL bandwidth. This allows for choosing a Frac-N PLL bandwidth that optimizes the jitter performance.

Figure 18:
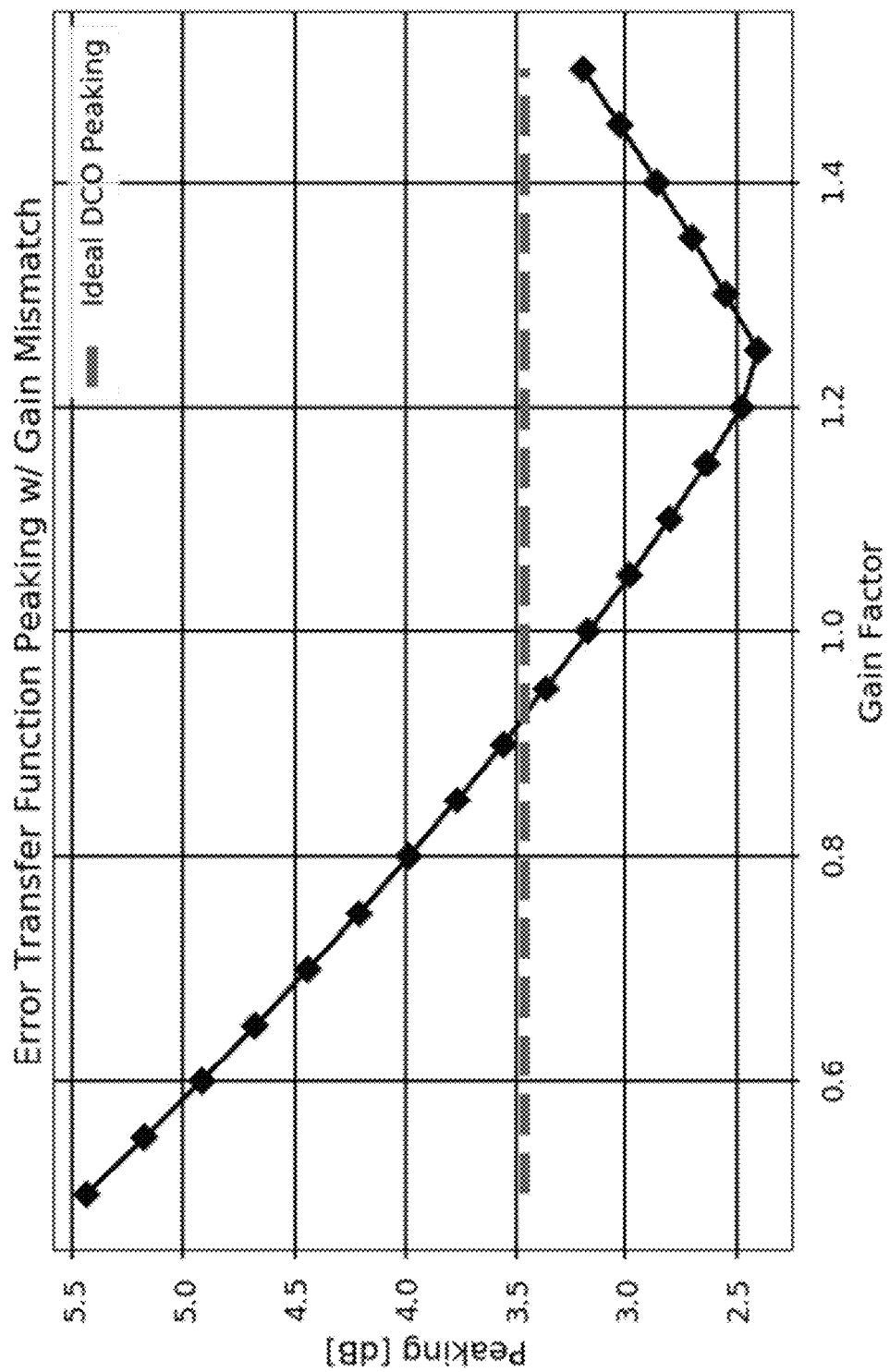
FIG. 18 shows the effect of gain mismatch on CDR error transfer function peaking.

It is to be noted that a VCO contributes to Frac-N PLL feedforward gain variation. As discussed before, the feedforward gain must match with Frac-N PLL KVCO to achieve an all-pass transfer function from $D_{CTRL}$ to $F_{OUT}$. This gain scaling is implemented in digital domain, whereas the $K_{VCO}$ of the analog VCO varies with process, temperature, and supply voltage. As a result, there is a mismatch between the digital gain scaling factor ($K_{VFF}$) and the Frac-N PLL gain. FIG. 18 shows the effect of gain mismatch on CDR error transfer function peaking. It indicates that for optimum performance, the digital path gain $K_{VFF}$ needs to be calibrated to match the analog gain inside Frac-N PLL.

Figure 19:
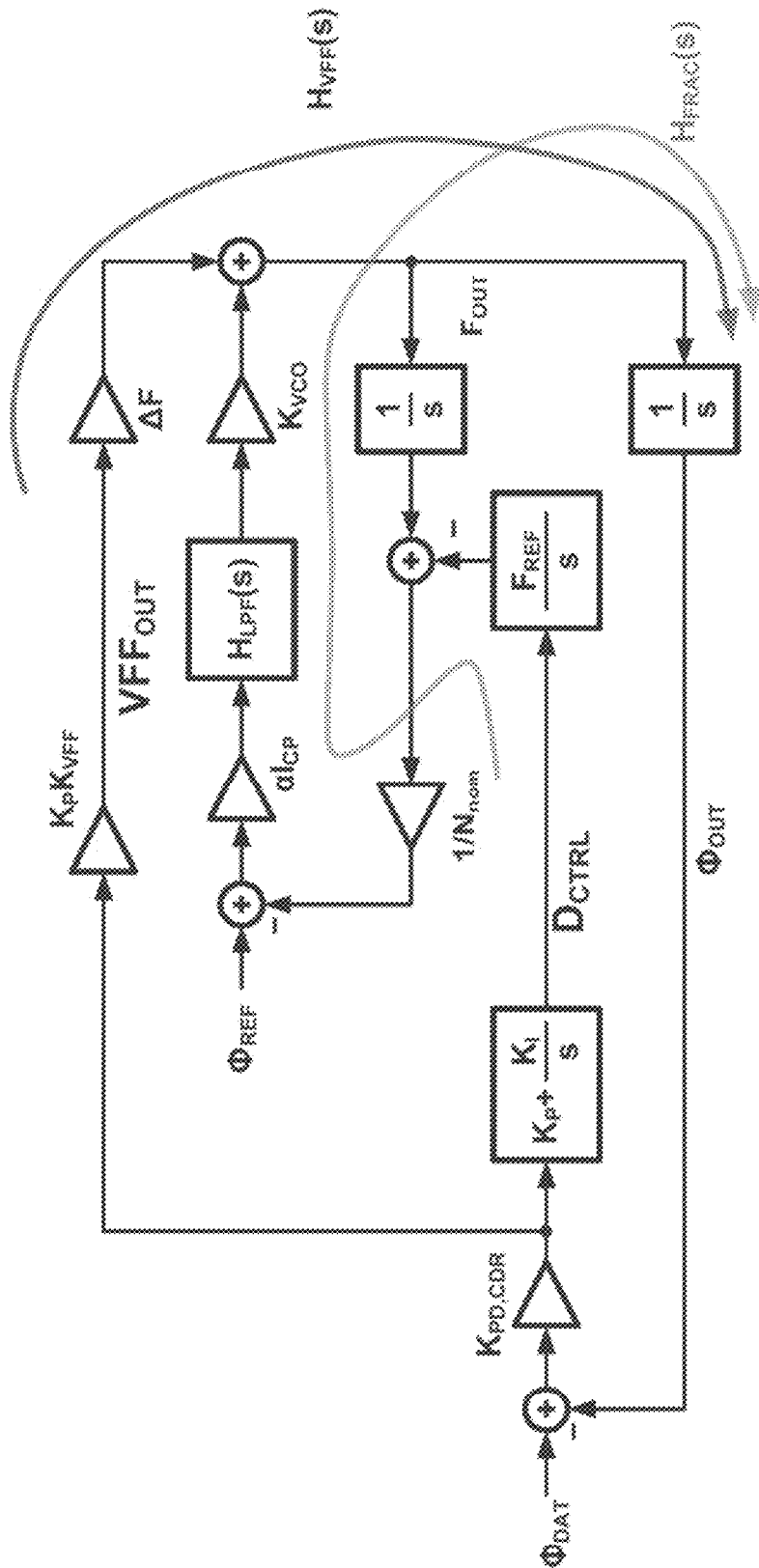
FIG. 19 is a simplified block diagram illustrating feed-forward gain calibration for Frac-N PLL implementation of CDR according to embodiments of the present invention.

FIG. 19 is a simplified block diagram illustrating feedforward gain calibration for Frac-N PLL implementation of CDR according to embodiments of the present invention. This diagram is merely an example, which should not unduly limit the scope of the claims. One of ordinary skill in the art would recognize many variations, alternatives, and modifications. More specifically, the foreground calibration technique illustrated in FIG. 9 involves matching digital feedforward path gain with that of analog path. As discussed above, the gain in the feedforward path (e.g., the $H_{VFF}(s)$ function) is to be matched with the gain Frac-N PLL path (e.g., the $H_{FRAC}(s)$ function).

Figure 20:
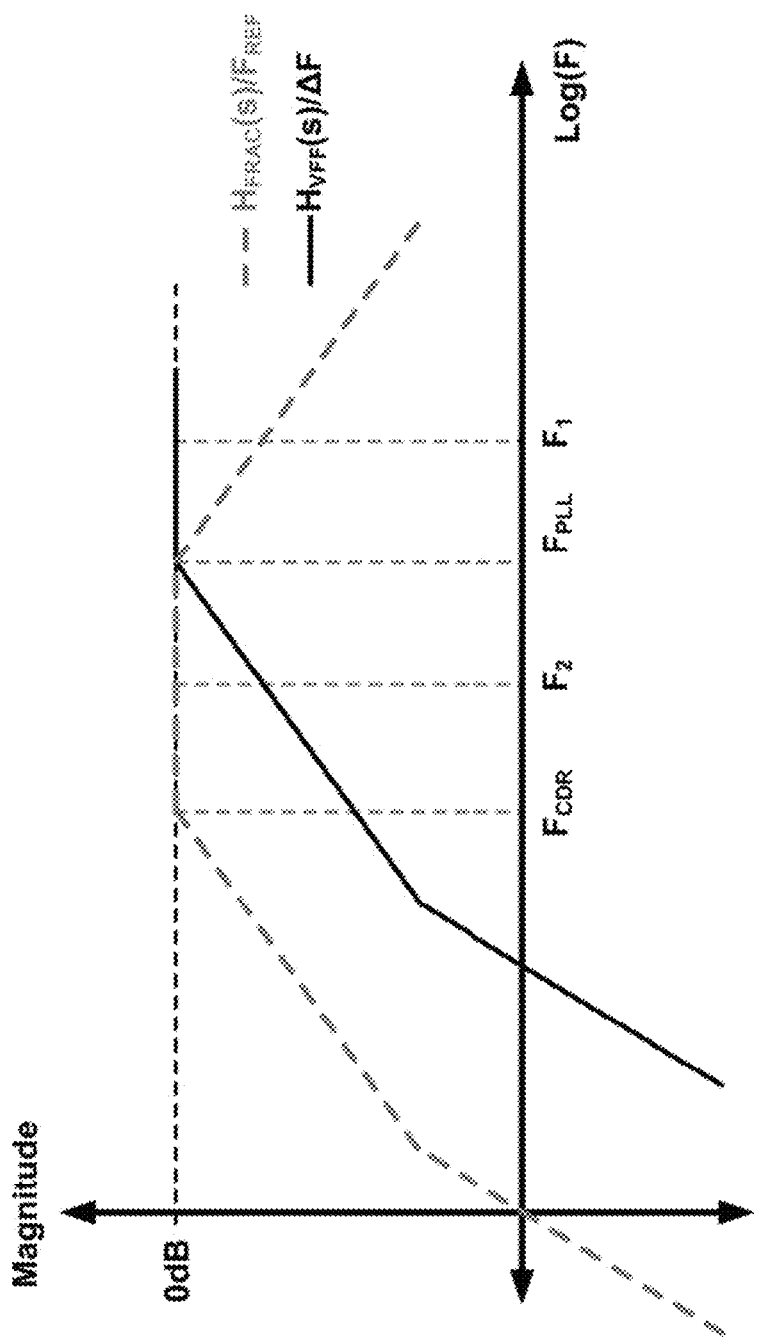
FIG. 20 shows transfer functions for each of the two paths. It is to be noted that signal injected in Frac-N PLL path at frequency $F_2$ has the same gain compared to the signal injected at frequency $F_1$ in the feedforward path.

FIG. 20 shows transfer functions for each of the two paths. It is to be noted that signal injected in Frac-N PLL path at frequency F2 has the same gain compared to the signal injected at frequency $F_1$ in the feedforward path. Variables $F_{CDR}$ and $F_{PLL}$ denote the bandwidths for CDR and Frac-N PLL respectively. To measure the output because of the injected signal, we utilize the CDR phase detector. Since the CDR phase detector provides digital output, it can be measured in-situ.

Figure 21:
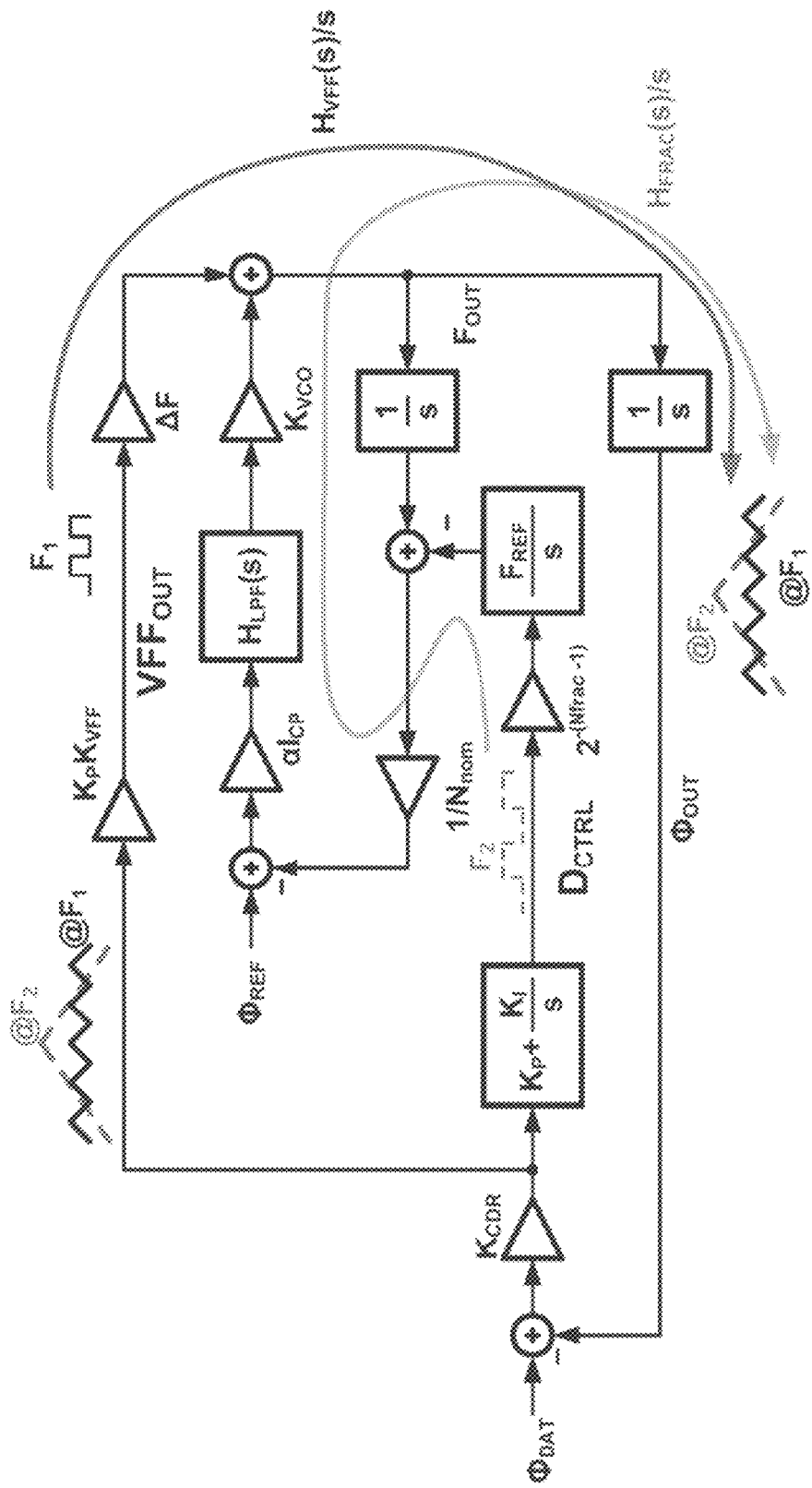
FIG. 21 is a simplified diagram illustrating a feedforward configuration with injected signals according to embodiments of the present invention.
Figure 22:
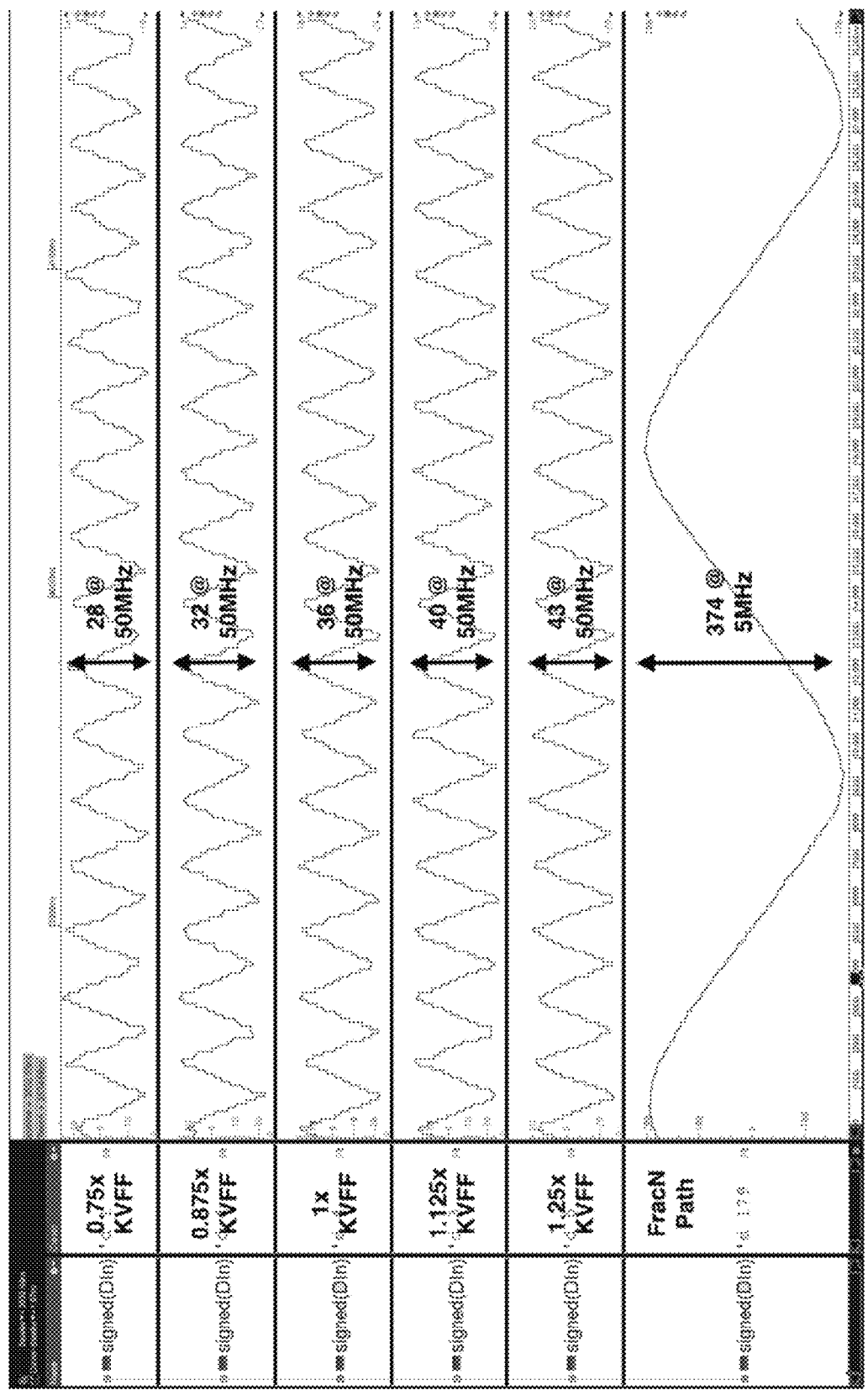
FIG. 22 provides simulation results of a feedforward implementation according to embodiments of the present invention.

FIG. 21 is a simplified diagram illustrating a feedforward configuration with injected signals according to embodiments of the present invention. This diagram is merely an example, which should not unduly limit the scope of the claims. One of ordinary skill in the art would recognize many variations, alternatives, and modifications. Digital square wave signals are injected through each path, and they create triangular signals at the CDR phase detector output. By detecting the peak-to-peak value of the triangular waveforms digitally, we can find the gain mismatch and correct for it by digitally adjusting $K_{VFF}$. FIG. 22 provides simulation results of a feedforward implementation according to embodiments of the present invention. As an example, it shows that for an expected ratio 10 for peak to peak values, $K_{VFF}$ path gain needs to match with Frac-N PLL path gain. For other scaling factors the ratio of peak-to-peak values deviates from 10.

It is to be appreciated that Frac-N PLLs can be implemented into CDR devices in various ways. For example, the combination and configuration of charge pump, VCO, and/or other components of a Frac-N PLL can be used to allow the Frac-N PLL to satisfy the requirements of CDR devices.

While the above is a full description of the specific embodiments, various modifications, alternative constructions and equivalents may be used. Therefore, the above description and illustrations should not be taken as limiting the scope of the present invention which is defined by the appended claims.

The wireless communications described in the present disclosure can be conducted in full or partial compliance with IEEE standard 802.11-2016, IEEE standard 802.16-2009, IEEE standard 802.20-2008, and/or Bluetooth Core Specification v4.0. In various implementations, Bluetooth Core Specification v4.0 may be modified by one or more of Bluetooth Core Specification Addendums 2, 3, or 4. In various implementations, IEEE 802.11-2016 may be supplemented by draft IEEE standard 802.11ah-2016 and/or draft IEEE standard 802.11ai-2016.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

In this application, apparatus elements described as having particular attributes or performing particular operations are specifically configured to have those particular attributes and perform those particular operations. Specifically, a description of an element to perform an action means that the element is configured to perform the action. The configuration of an element may include programming of the element, such as by encoding instructions on a non-transitory, tangible computer-readable medium associated with the element.

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A clock and data recovery (CDR) device, comprising:
a digital phase detector circuit configured to (i) receive a data signal and an output clock signal, (ii) detect a phase difference between the data signal and the output clock signal, and (iii) generate a phase difference signal based on the detected phase difference; and
a fractional-N phase lock loop (Frac-N PLL) circuit configured to control either one of an output frequency and an output phase of the output clock signal according to a digital frequency control signal that is based on the detected phase difference between the data signal and the output clock signal, the Frac-N PLL circuit being configured to (i) receive the digital frequency control signal and a reference clock signal, the digital frequency control signal being indicative of the phase difference between the data signal and the output clock signal (ii) generate the output clock signal using an oscillator that is controlled in accordance with the digital frequency control signal and the reference clock signal,
wherein the Frac-N PLL circuit comprises a feedforward path circuit that includes a sigma delta modulator configured to generate an oscillator compensation signal based on the digital frequency control signal and a digital gain scaling factor.

2. The CDR device of claim 1, further comprising a filter circuit configured to (i) receive the phase difference signal and (ii) generate the digital frequency control signal based on the phase difference signal, the digital frequency control signal controlling the oscillator to adjust one of the output frequency and the output phase of the output clock signal.

3. The CDR device of claim 2, wherein the filter circuit is a digital loop filter.

4. The CDR device of claim 1, wherein the oscillator is a voltage-controlled oscillator (VCO) configured to generate the output clock signal based on an oscillator control signal and the oscillator compensation signal.

5. The CDR device of claim 4, wherein the Frac-N PLL circuit has an associated frequency roll off, the oscillator compensation signal being configured to reduce the frequency roll off introduced by the Frac-N PLL circuit.

6. The CDR device of claim 1, wherein the digital frequency control signal includes a frequency control word configured as a frequency control input of the Frac-N PLL circuit.

7. The CDR device of claim 6, wherein the output frequency of the output clock signal corresponds to a product of the frequency control word and a gain of the Frac-N PLL circuit.

8. The CDR device of claim 1, wherein the Frac-N PLL circuit comprises: a second sigma delta modulator configured to generate a frequency control signal based on the digital frequency control signal; a frequency divider circuit configured to generate a divided clock signal based on the output clock signal and the frequency control signal generated by the second sigma delta modulator; and a phase detector configured to generate a phase detection signal based on the reference clock signal and the divided clock signal.

9. The CDR device of claim 8, wherein the Frac-N PLL circuit further comprises:
   a charge pump configured to generate current pulses based on the phase detection signal; and
   a loop filter configured to generate an oscillator control signal based on the current pulses.

10. The CDR device of claim 9, wherein the second sigma delta modulator is configured to convert the digital frequency control signal to the frequency control signal based on an integer division ratio.

11. The CDR device of claim 8, wherein the frequency divider circuit comprises a multi-modulus divider configured to generate the divided clock signal.

* * * * *